United States Patent [19]

Kokubo et al.

[11] Patent Number: 4,871,912
[45] Date of Patent: Oct. 3, 1989

[54] CONTROL SYSTEM USING EXTERNAL COMPUTER FOR ELECTRON MICROSCOPE

[75] Inventors: Yasushi Kokubo; Keisuke Suzuki; Seiichiro Mori, all of Tokyo, Japan

[73] Assignee: JEOL Ltd., Tokyo, Japan

[21] Appl. No.: 168,266

[22] Filed: Mar. 15, 1988

[51] Int. Cl.$^4$ .............................................. H01J 37/26
[52] U.S. Cl. .................................... 250/311; 250/310; 250/306
[58] Field of Search ................. 250/310, 311, 306, 396

[56] References Cited

U.S. PATENT DOCUMENTS

| | | | |
|---|---|---|---|
| 4,451,737 | 5/1984 | Isakozawa | 250/311 |
| 4,531,057 | 7/1985 | Kobayashi | 250/311 |
| 4,547,669 | 10/1985 | Nakagawa et al. | 250/310 |
| 4,567,364 | 1/1986 | Kano et al. | 250/310 |
| 4,724,319 | 2/1988 | Shirota | 250/311 |

OTHER PUBLICATIONS

"An Electron Microscope Controlled by an External Computer", by Y. Kokubo, K. Suzuki, S. Mori, J. Suzumi, M. Taira and A. J. Skarnulis, in Proc. XIth International Congress on Electron Microscopy, Kyoto, 1986, pp. 497-498.

Primary Examiner—Janice A. Howell
Assistant Examiner—Michael Aronoff
Attorney, Agent, or Firm—Webb, Burden, Ziesenheim & Webb

[57] ABSTRACT

The basic unit of a modern electron microscope incorporates a computer, a ROM, and a RAM. According to this invention, an external computer connected with the microscope also has a RAM. In the initial condition, the contents of the ROM in the microscope are read into the RAM of the external computer. When the magnification is set to a desired value, the external computer selects currents which are fed to the electron lenses and deflector coils, corresponding to the two values of magnification closest to the desired value of magnification, from the data stored in the ROM. Then, the computer calculates the currents which should be fed to the lenses and coils, corresponding to the desired value of magnification, from the selected values. The obtained data is held in either RAM. The external computer controls the lenses and coils according to the data held in this RAM.

6 Claims, 1 Drawing Sheet

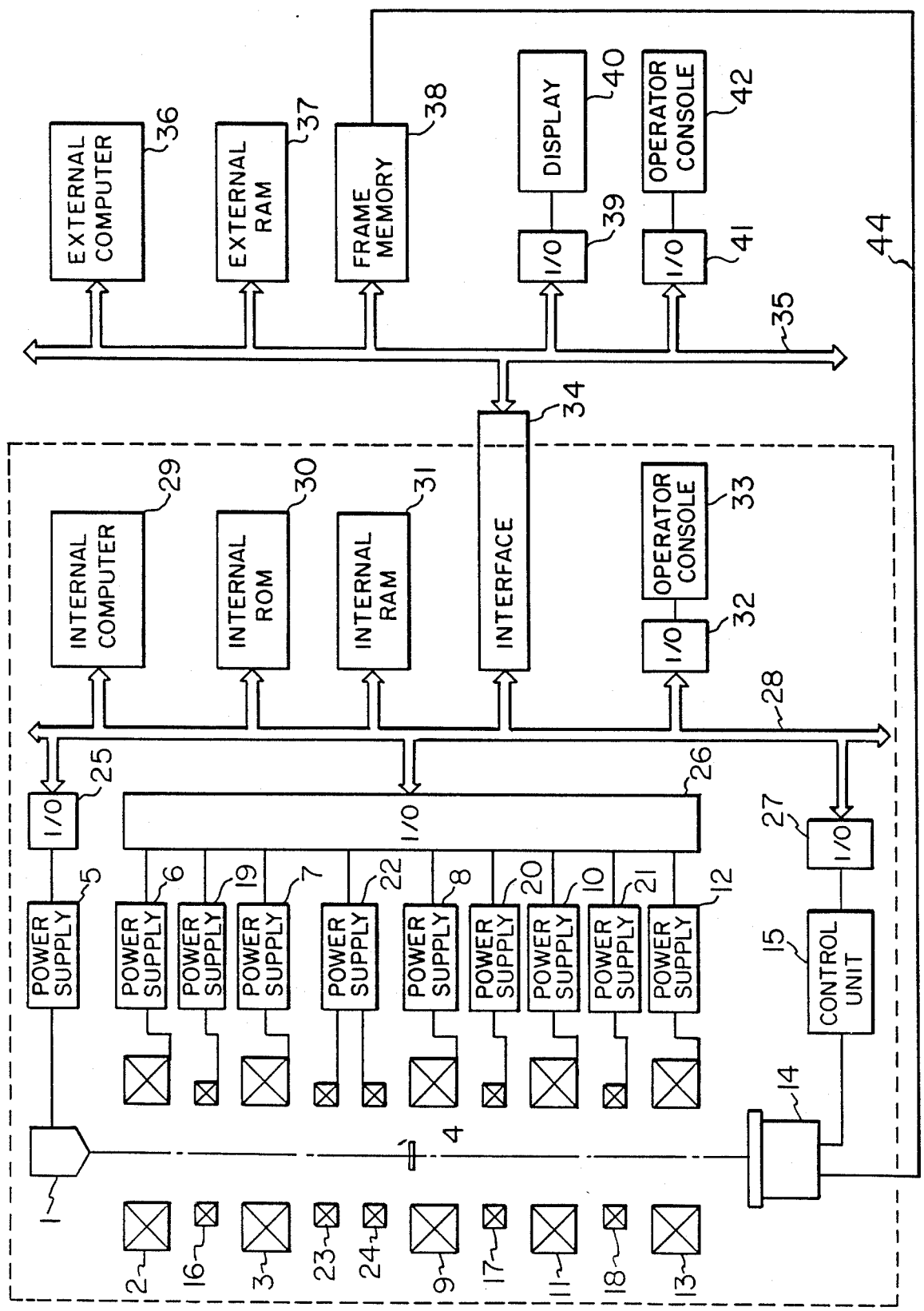

CONTROL SYSTEM USING EXTERNAL COMPUTER FOR ELECTRON MICROSCOPE

FIELD OF THE INVENTION

This invention relates to a control system using an external computer for an electron microscope such as a transmission electron microscope or scanning electron microscope.

BACKGROUND OF THE INVENTION

Electron microscopy has been highly developed, and high-resolution electron microscopy has enabled observation of individual atoms. Today, commercial instruments are required to satisfy many demands, such as new functions, easy operations, and high cost performance. Therefore, microprocessors have been incorporated in electron microscopes. This permits storage of specimen positions, automatic montaging, image rotation, and display of the present conditions of the microscope, which could not be envisaged before the introduction of microprocessors. Accurate beam alignment, accurate correction of astigmatism, and optimum focusing are crucial for practical use of a high-resolution electron microscope. If a computer performs these jobs instead of the operator, a tremendous amount of labor and time would be saved, and any operator can make the best use of the microscope. Besides these demands for control over the microscope, many other requirements, such as image simulation and image processing, are imposed on high-resolution electron microscopy. However, the present microprocessor is not capable of meeting all of these demands.

Recently, external computer and an image frame memory have been combined with an electron microscope, as disclosed in an article entitled "An Electron Microscope Controlled by an External Computer" by Y. Kokubo, K. Suzuki, S. Mori, J. Suzumi, M. Taira, and A. J. Skarnulis, in Proc. XIth International Congress on Electron Microscopy, Kyoto, 1986, pp. 497–498.

An electron microscope, such as a transmission electron microscope or scanning electron microscope, includes an electron gun, a high voltage-generating circuit, electromagnetic lenses, deflector coils, power supplies for the electromagnetic lenses, and power supplies for the deflector coils. The number of the electromagnetic lenses tends to increase whenever a new function is added to the microscope. The latest electron microscopes each have 9 electromagnetic lenses. Also, the number of deflector coils increases in proportion to the number of the electromagnetic lenses.

As mentioned previously, a recent electron microscope incorporates a computer such as a microprocessor. This microscope also includes a read-only memory (ROM) in which data about the optimum values of electric currents supplied to the electron lenses and the deflector coils is stored. These values of the currents are determined according to preset values of magnification and preset values of accelerating voltage. The combinations of the values of these currents are so set that the image does not rotate if the magnification or the accelerating voltage is changed. When the operator keys in the magnification and the accelerating voltage, the internal computer controls the electron gun power supply, the electron lens power supply, and the deflector coil power supply, based on the data stored in the ROM. The data stored in the ROM indicates discrete values of the magnification and discrete values of the accelerating voltage.

An attempt has been made to analyze the image signal obtained by such an electron microscope incorporating a computer, by means of an external computer connected to the microscope. In the prior art combination of the electron microscope and the external computer, the external device produces signals only to independently energize the electromagnetic lenses and the deflector coils of the microscope. Therefore, if the currents fed to the lenses and coils are varied to change the magnification, then the image will be rotated. In extreme cases, the currents may increase or decrease intolerably. This makes it impossible to observe the image, or the microscope breaks down. Consequently, when the operator desires to change the magnification or the accelerating voltage under the instruction of the external computer, the only one possible method is to select the closest value of the magnification or voltage from the values stored in the ROM. Thus, it is impossible to energize the electromagnetic lenses and the deflector coils so as to achieve desired magnification and accelerating voltage without causing rotation of the image or other undesirable situation. Similar problems arise in varying the size of the electron beam spot, the amount of defocusing of the objective lens, or the amount of correction made for astigmatism.

SUMMARY OF THE INVENTION

It is a main object of the invention to provide a method for permitting one to use an electron microscope incorporating a ROM under conditions other than the observational conditions built into the ROM.

It is another object of the invention to provide a control system which uses an external computer to permit one to continuously vary the magnification and the accelerating voltage of an electron microscope.

It is a further object of the invention to provide a control system which uses an external computer to enable one to continuously and arbitrarily vary the size of the spot of an electron beam impinging on a specimen, the amount of defocusing, the amount of correction made for astigmatism, diffraction camera length, convergent beam angle, or tilt angle, etc.

In accordance with the present invention, the basic unit of an electron microscope incorporates a computer, a ROM, and a RAM, and the microscope is connected with an external computer having a RAM. In the initial condition, the contents of the ROM of the microscope are read into the RAM of the external computer. As an example, when the magnification is set to a desired value, the external computer selects data concerning the electric currents fed to the electron lenses and the deflector coils from the data stored in the ROM, the currents corresponding to the two magnification values; one of these two values is immediately larger than the desired value, while the other is immediately smaller than the desired value. Then, the computer calculates the currents which correspond to the desired magnification and are fed to the lenses and the coils, from the selected data. The calculated values are written to either RAM. The external computer controls the electron lenses and the deflector coils of the microscope according to the values held in this RAM.

BRIEF DESCRIPTION OF THE DRAWING

The drawing is a block diagram of a control system for an electron microscope, the system being fabricated in accordance with the invention.

DETAILED DESCRIPTION OF THE PREFERRED EMBODIMENT

Referring to the drawing, the basic unit of an electron microscope incorporating a computer system is surrounded by the broken line. The microscope includes an electron gun 1 for producing an electron beam. This beam is then accelerated and converged by a first condenser lens 2 and a second condenser lens 3. Finally, the beam impinges on a specimen 4. An accelerating voltage is applied to the electron gun 1 from an accelerating voltage source 5. Energizing currents are fed to the condenser lenses 2 and 3 from a first condenser lens power supply 6 and a second condenser lens power supply 7, respectively. A magnified electron optical image of the specimen 4 is projected on the face of an image intensifier 14 by an objective lens 9, and intermediate lens 11, and a projector lens 13 which are energized with currents supplied from power supplies 8, 10, 12, respectively. Usually, further intermediate lenses (not shown) are mounted between the intermediate lens 11 and the projector lens 13. The operation of the image intensifier 14 is controlled by a control device 15.

Deflector coils 16, 17, 18 are arranged along the optical axis of the electron beam emitted by the gun 1, in order to align the beam. The coils 16, 17, 18 are connected with power supplies 19, 20, 21, respectively. Deflector coils 23 and 24 that are supplied with currents from a power supply 22 are disposed between the second condenser lens 3 and the objective lens 9. The incident angle of the electron beam to the specimen 4 can be varied at will by means of the deflector coils 23 and 24.

The accelerating voltage source 5, the power supplies for the electron lenses and the deflector coils, and the image intensifier control device 15 are connected with an internal computer bus 28 via I/0 ports 25, 26, 27, respectively. An internal computer 29, an internal ROM 30, and an internal RAM 31 are connected with the bus 28. Also, an operator's console 33 including a keyboard is connected with the bus 28 via an I/0 port 32, such as an RS232C serial interface. A table of the values of the electric currents which are fed to the electron lenses and deflector coils according to various values of magnification and various values of accelerating voltage is stored in the internal ROM 30. Also, data about the values of currents fed to the lenses and coils according to various sizes of electron beam spot, various amounts of defocusing of the objective lens, various amounts of correction made for astigmatism, and other amounts are stored in the ROM 30. The internal computer bus 28 is coupled to an external computer bus 35 via an RS232C serial interface 34. An external computer 36, and external RAM 37, and a frame memory 38 are tied with the bus 35. A display unit 40 such as a CRT is connected to the bus 35 via an I/0 port 39. An operator's console 42 including a keyboard is connected with the bus 35 via an I/0 port 41.

In the configuration constructed as described above, the operator enters desired accelerating voltage and magnification from the operator's console 33. Then, the internal computer 29 controls the accelerating voltage source 5 to achieve the entered accelerating voltage. Also, the computer 29 reads data about the specified accelerating voltage and magnification from the ROM 30, and controls the power supplies 6, 7, 8, 10, 12 for the electron lenses and the power supplies 19, 20, 21, 22 for the deflector coils according to the data read out in this way. As a result, an image of the specimen is projected on the face of the image intensifier 14 at the desired magnification and at the desired accelerating voltage. In this case, the operator must select values from the discrete values of magnification and accelerating voltage stored in the ROM. The image projected on the fact of the intensifier 14 is converted into an electrical signal, which is fed via a video cable 44 to the frame memory 38 and stored in this memory 38 connected with the external computer bus 35. When the external computer bus 35 is connected with the internal bus 28, all the data stored in the internal ROM 30 is transferred via the serial interface 34 to the external RAM 37 and held there under the control of the external computer 36.

The external computer 36 processes the image data stored in the frame memory 38 by fast Fourier transform or other method to analyze the data. Then, the computer calculates the amount of correction made for the defocusing of the objective lens 9, the spot size of the electron beam on the specimen, the amount of correction made for astigmatism, and other amounts, based on the result of the analysis, so as to attain the optimum conditions of observation. The external computer 36 further calculates the values of currents fed to the lenses and coils from the data stored in the external RAM 37 so that the amount of defocusing of the objective lens and the spot size of the beam on the specimen may coincide with the calculated values. When the operator specifies any desired magnification through the operator's console 42, the external computer 36 calculates the values of currents supplied to the lenses and coils, from the data stored in the external RAM 37, in order to accomplish the desired magnification without rotating the image. Since various values calculated by the external computer are based on the data previously stored in the internal ROM, the normal operation of the electron microscope is not hindered.

More specifically, if the specified magnification $M_0$ does not exist in the table stored in the internal ROM, then the external computer 36 selects the values of currents corresponding to the two values of magnification closest to the specified value, from the values stored in the external RAM 37. This RAM 37 stores the values of currents which are fed to the lenses and coils, corresponding to various values of accelerating voltage and magnification. Then, the computer calculates, for example by interpolation, the values of currents which are fed to the lenses and coils and produce the specified magnification without rotating the image. For instance, the operator enters 1100 as the magnification $M_0$ from the operator's console 42. The computer 36 then extracts data corresponding to the two values of magnification $M_1$ and $M_2$ closest to the magnification $M_0$, from the values of currents which are fed to the lenses and coils and stored in the RAM 37. $M_1$ is immediately smaller than $M_0$, while $M_2$ is immediately larger than $M_0$. That is, $$M_1 < M_0 < M_2$$

As an example, $M_1$ and $M_2$ are equal to 1000 and 1200, respectively. The external computer 36 calculates by interpolation the values of the currents that give the magnification of 1100, from the data corresponding to the magnifications $M_1$ and $M_2$. The computed current values are routed via the serial interface 34 to the internal RAM 31 and stored there. The internal computer 29 controls the power supplies for the lenses and the power supplies for the coils in accordance with the values stored in the internal RAM 31 under the instruction from the external computer 36. As a result, an electron image is projected on the face of the intensifier 14 at the desired magnification.

In the description made above, the values of currents which are fed to the lenses and coils and give the specified magnification are stored in the internal RAM 31. Desired currents are furnished to the lenses and coils under the control of the internal computer 29. It is also possible to store the current values giving rise to the specified magnification in the external RAM 37 and to cause the external computer 36 to control the lenses and coils.

In controlling the electron lenses which focus the electron beam into a spot of a desired size, the operator enters a desired spot size $d_0$ from the operator's console 42 or the external computer 36 calculates the desired size $d_0$. As an example, if the operator sets the spot size $d_0$ to 125 Å, then the external computer 36 reads from the external RAM 37 the values of currents which are fed to the lenses and correspond to the two spot sizes $d_1$ and $d_2$ closest to the size $d_0$; $d_1$ is immediately smaller than $d_0$, whereas $d_2$ is immediately larger than $d_0$. Where the discrete sizes of spot which have been previously stored in the internal ROM 30 and are held in the external RAM 37 are expressed in units of 50 Å, $d_1$ and $d_2$ are 100 Å and 150 Å, respectively. The external computer 36 calculates by interpolation the values of currents which are fed to the electron lenses disposed along the illuminating electron beam to accomplish the desired spot size $d_0$, from the data about the current values corresponding to the sizes $d_1$ and $d_2$. The computed data is sent and written to the internal RAM 22. The internal computer 20 controls the power supplies 6 and 7 for the first and second condenser lenses in accordance with the data stored in the internal RAM 22. If the specified magnification, the spot size of electron beam, or the amount of defocusing of the objective lens does not lie within the range previously stored in the internal ROM 30, then the external computer 36 will reject the specified value. Consequently, it is unlikely that the image cannot be observed or that the electron microscope breaks down.

The amount of defocusing of the electron beam and the astigmatism-correcting coils are controlled in like manner. The invention can be also applied to the case where a small condenser lens (not shown) is installed between the second condenser lens 3 and the objective lens 9. The angle at which the electron beam impinging on the specimen 4 spreads is controlled by controlling the small lens, using the external computer. Further, the invention is applicable to the case in which the angle of the electron beam hitting the specimen 4 is set to any desired value by controlling the deflector coils 22 and 23 through the use of the external computer. In these cases, the convergent beam angle and the tilt angle are controlled within the ranges previously built into the internal ROM 30. In the examples described above, the electron microscope is of the transmission type. Of course, the invention can also be applied to scanning electron microscopes.

Having thus defined our invention with the detail and particularity required by the Patent Laws, what is claimed and desired to be protected by Letters Patent is set forth in the following claims.

What is claimed is:

1. A method of controlling an electron microscope having electron lenses and deflector coils by an external computer, the microscope incorporating an internal computer and a ROM in which are stored data correlating optimum values of electric currents and voltages supplied to the electron lenses and the deflector coils determined according to preset values of magnification and preset values of accelerating voltage such that an image does not rotate if the magnification or the accelerating voltage is changed, said method comprising the steps of:
    transmitting the data stored in the ROM to an external RAM associated with the external computer;
    calculating in the external computer data defining desired conditions of observation from the data held in the RAM wherein the data defining desired conditions of observation is calculated using an interpolation function; and
    transmitting the data resulting from said calculations to the internal computer of the electron microscope for controlling the electron microscope according to the calculated data.

2. The method of claim 1, wherein the microscope has electron lenses and deflector coils and wherein the data stored in the ROM is data correlating electric currents which are fed to the electron lenses and the deflector coils of the microscope with various values of accelerating voltage and various values of magnification.

3. The method of claim 1, wherein the microscope has electron lenses for focussing an electron beam to irradiate a spot on a specimen, wherein the data stored in the ROM is data correlating electric currents which are fed to the electron lenses with various spot sizes of electron beam.

4. A system for controlling an electron microscope having electron lenses and deflector coils for focussing and directing an electron beam to irradiate a spot on a specimen and means to supply electric currents to said lenses and coils,
    said microscope including an internal computer including a memory that stores data correlating the optimum values of electric currents and voltages supplied to the electron lenses and the deflector coils determined according to preset values of magnification and preset values of accelerating voltage such that the image does not rotate if the magnification or the acceleration voltage is changed, and a means for producing an image signal;
    a frame memory that stores the image signal;
    an external computer connected with the internal computer, said external computer programmed to analyze the image signal stored in the frame memory, said external computer having a memory to which the data correlating conditions of observation stored in the internal computer memory are transferred;
    a display means for displaying the results of the analysis made by the external computer;
    a data entry means which permits entry of conditions; and
    said external computer programmed to calculate data defining the electric currents to be fed to the lenses and the deflector coils of the microscope, from the entered conditions and from the data transferred and held in the memory of the external computer wherein the data defining desired conditions of observation is calculated using an interpolation function.

5. The system of claim 4, wherein the data stored in the internal computer memory is data correlating the currents which are fed to the electron lenses and the deflector coils with various values of accelerating voltage and various values of magnification.

6. The system of claim 5, wherein the data stored in the internal computer memory is data correlating the currents which are fed to the electron lenses with various spot sizes of electron beam.

* * * * *

UNITED STATES PATENT AND TRADEMARK OFFICE
CERTIFICATE OF CORRECTION

PATENT NO. : 4,871,912

DATED : October 3, 1989

INVENTOR(S) : Yasushi Kokubo, Keisuke Suzuki and Seiichiro Mori

It is certified that error appears in the above-identified patent and that said Letters Patent is hereby corrected as shown below:

Title page:

After the application filing date insert
--Foreign Application Priority Data
March 19, 1987 [JP] Japan 62-65299--.

Column 5 Line 32 "$\overset{o}{A}$and" should read --$\overset{o}{A}$ and--.

Claim 4 Line 50 Column 6 "acceleration" should read --accelerating--.

Signed and Sealed this

Eighteenth Day of September, 1990

Attest:

HARRY F. MANBECK, JR.

*Attesting Officer*     *Commissioner of Patents and Trademarks*